March 10, 1970 J. I. RHODES 3,500,219
AUDIO AMPLIFIER
Filed Aug. 15, 1966
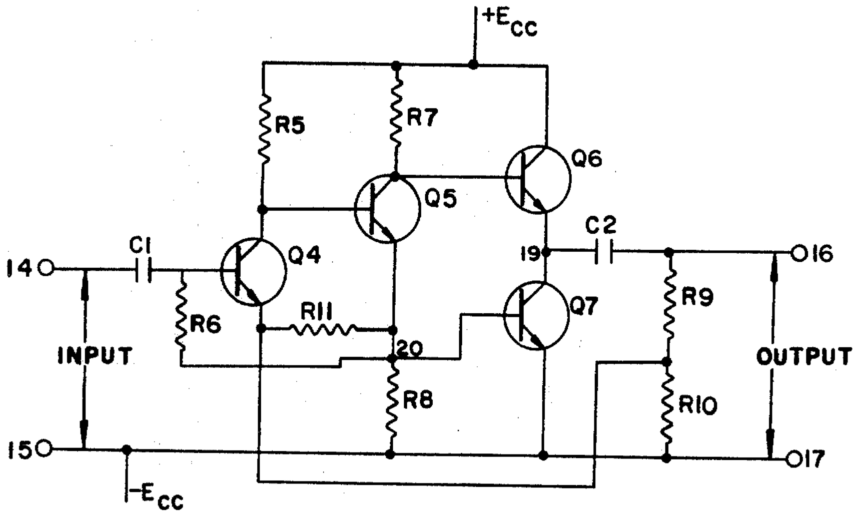
INVENTOR
JUNIOR I. RHODES
BY Thomas A. Briody
ATTORNEY United States Patent Office 3,500,219
Patented Mar. 10, 1970

3,500,219

AUDIO AMPLIFIER

Junior I. Rhodes, Lynchburg, Va., assignor to General Electric Company, a corporation of New York Filed Aug. 15, 1966, Ser. No. 572,404
Int. Cl. H03f *3/04*
U.S. Cl. 330—14 5 Claims

ABSTRACT OF THE DISCLOSURE

A Class B signal amplifier wherein first, second, third and fourth transistors are of the same conductivity type. A Class A driver stage includes the first transistor directly connected to drive the second and third transistors, which are connected in series for direct current as a Class B output stage. The fourth transistor is connected to the first transistor to operate as a common-emitter signal amplifier. With this arrangement, there is provided a negative feedback means connected from the output to the base of the fourth transistor. The negative feedback means stabilizes gain and improves the linearity of the amplifier.

This invention relates to an improved signal amplifier, and more particularly to an improved signal amplifier wherein all of the active elements are transistors of the same conductivity type.

Class B signal amplifiers and particularly those used for amplifying audio frequency signals, while providing efficient operation with relatively low power supply drain, commonly employ transformer networks in the input and output circuits. To eliminate these networks in transistorized amplifier circuits, it has been the most common practice in the past to use transistor pairs of opposite conductivity type. One disadvantage to this results from the fact that it is rather difficult to match the pairs of transistors because one is not inherently symmetrical to the other. Prior art integrated circuits have been designed, however, in which a pair of transistors of the same conductivity type have been used for the Class B output stage, and a transistor of the same conductivity type has been used as a Class A driver stage. In using such integrated circuits as this on a commercial basis, a considerable difficulty has arisen in stabilizing the biasing point for Class B operation. Accordingly, an important object of my invention is to provide an improved signal amplifier which is capable of effectively maintaining Class B operating conditions.

Another object of my invention is to provide an improved signal amplifier which includes a plurality of transistors of the same conductivity type and an effective means for maintaining operative conditions for variant supply voltage and temperatures.

Still another object of my invention is to provide an improved circuit which readily lends itself to effective incorporation in a single monolithic clip.

In carrying out my invention, in one form thereof, there is provided a signal amplifier which includes a Class A driver for driving a Class B split load output wherein the active elements are direct coupled transistors of the same conductivity type. More particularly, this amplifier comprises first, second, third and fourth transistors of the same conductivity type. The second and third transistors are connected in series for direct current as a Class B output stage. The Class A driver stage includes the first transistor connected in such a manner as to drive the second and third transistors, and the fourth transistor connected to the first transistor and operable as a common-emitter signal amplifier. With this arrangement, I have provided a negative feedback means connected from the output to the base of the fourth transistor. This negative feedback means stabilizes gain and improves the linearity of the amplifier. Such an approach is simple, and efficient in operation.

Further aspects of my invention will become apparent hereinafter, and the specification concludes with claims particularly pointing out and distinctly claiming the subject which I regard as my invention. The invention, however, as to organization and method of operation, together with further objects and advantages thereof, may best be understood by reference to the following description when taken in conjunction with the accompanying drawing which depicts a circuit diagram of an embodiment of my invention.

Referring now to the circuit diagram embodying my invention, shown therein is a three stage amplifier employing four transistors $Q_4$, $Q_5$, $Q_6$ and $Q_7$, all of the same conductivity type, namely NPN. PNP type transistors could also be advantageously used, providing the supply connections are appropriately reversed as is well known in the art.

The input signal is applied between terminals 14 and 15 and the power supply voltage is indicated as $+E_{cc}$ and $-E_{cc}$. The power supply is connected as shown, and the output is taken between terminals 16 and 17. The split-load output Class B stage comprises transistors $Q_6$ and $Q_7$, which are connected in series across the power supply. Capacitors $C_1$ and $C_2$ are DC decoupling capacitors, capacitor $C_1$ being connected between input terminal 14 and the base of transistor $Q_4$, and the capacitor $C_2$ being connected between the common point 19 (of the emitter of transistor $Q_6$ and the collector of transistor $Q_7$) and the output terminal 16. The collector of $Q_4$ is connected to the positive terminal of the power supply through resistor $R_5$ and is directly coupled to the base of transistor $Q_5$. The emitter of $Q_4$ is connected intermediate voltage divider resistors $R_9$ and $R_{10}$. The collector of transistor $Q_5$ is connected through resistor $R_7$ to the positive terminal of the power supply and is directly connected to the base of $Q_6$. The emitter of $Q_5$ is directly connected to the base of $Q_7$, and through resistor $R_8$ to the negative terminal of the power supply. The voltage divider including resistors $R_9$ and $R_{10}$ is connected across the output. Resistor $R_6$ is connected between the base of $Q_4$ and the emitter of $Q_5$, via point 20.

The drop across $R_7$ may be approximately half of the supply voltage. The drop across $R_8$ is preferably just sufficient to bias $Q_7$ to small forward current, which for Class B operation may be approximately one-half a volt for silicon transistor. $R_7$ should preferably be much larger than $R_8$.

Basically, the circuit embodying my invention is a split-load phase inverter comprising a Class B series connected output stage including output transistors $Q_6$ and $Q_7$ driven by a Class A driver stage. On the positive half cycle of the applied input signal, the transistor $Q_5$ acts as a common emitter signal amplifier to drive the transistor $Q_6$ as a common collector signal amplifier. On the negative half cycle of the applied input signal, transistor $Q_5$ operates as a common collector signal amplifier to drive transistor $Q_7$ as a common emitter signal amplifier.

The illustrated circuit uses the base emitter voltage of a low current Class A stage $Q_4$ to control the idle current of the Class B output stages $Q_6$ and $Q_7$. This is done by providing a low voltage drop DC path between the bases of $Q_4$ and $Q_7$ including the resistor $R_6$ and also between the emitters of $Q_4$ and $Q_7$. The current through $Q_4$ is determined by $R_5$ and this can be used to adjust the base-emitter diode voltage of $Q_4$ and $Q_7$ and therefore the current in $Q_7$, $R_6$ stabilizes the operating point of $Q_7$ by providing DC negative feedback around $Q_4$ and $Q_5$. Since both transistors are exposed to the same ambient temperature, they will maintain the approximately same bias current ratio in spite of changes in ambient temperature. The voltage across an *e-b* junction, as is well known in the art, characteristically varies by approximately −2 millivolts per ° C., which changes bias current with temperature. If $Q_4$ and $Q_7$ are tied together thermally such as is the case when they are both included in the same substrate, even internally generated temperature changes will not alter the idle current of $Q_7$. The connection between the voltage divider including resistors $R_9$ and $R_{10}$ and the emitter of $Q_4$ supplies negative feedback for stabilizing gain and improving linearity. The bias for $Q_7$ is developed across $R_8$.

$R_{11}$ provides positive feedback to the AC signal to cancel out the distortions caused by the unbalanced alternating current degeneration. This degeneration is caused as a side effect of the D.C. feedback circuit of $R_6$.

It will thus be seen that the transistor $Q_4$ functions as a common-emitter signal amplifier.

Typical values for the components of the various circuits shown may be as follows:

| | |
|---|---|
| $R_5$=100,000 ohm | $E_{cc}$=12 v. |
| $R_6$=40,000 ohm | $C_1$=.1 mfd. |
| $R_7$=1,000 ohm | $C_2$=150 mfd. |
| $R_8$=100 ohm | $Q_1$=2N2192—Silicon NPN |
| $R_9$=20,000 ohm | $Q_2$=2N2192—Silicon NPN |
| $R_{10}$=220 ohm | $Q_3$=2N2192—Silicon NPN |
| $R_{11}$=5,600 ohm | $Q_4$=2N2192—Silicon NPN |

It will now, therefore, be seen that I have provided a new and improved transistorized amplifier circuit using all transistors of the same conductivity type and affording an effective means for stabilizing the gain and improving the linearity.

While in accordance with the patent statutes, I have described what at present is considered to be the preferred embodiment of my invention, it will be obvious to those skilled in the art that various changes and modifications may be made therein without departing from my invention and I, therefore, aim in the following claims to cover all such equivalent variations as fall within the true spirit and scope of this invention.

I claim:

1. A Class B signal amplifier including
first, second, third and fourth transistors of the same conductivity type each having base, collector and emitter electrodes,
means connecting said second and third transistors in series for direct current as a Class B output stage for said amplifier, means providing an output circuit connected to the emitter of said second transistor and to the collector of said third transistor,
a Class A driver stage including said first transistor,
means directly connecting the collector of said first transistor to the base of said second transistor,
means directly connecting said emitter of said first transistor to the base of said third transistor,
signal input means connected to the base of said fourth transistor,
means connecting the collector of said fourth transistor to the base of said first transistor,
said fourth transistor being operative on both half cycles of the applied input signal as a common emitter signal amplifier to drive said first transistor,
said first transistor being operative on one half cycle of the applied input signal as a common emitter signal amplifier to drive said second transistor as a common collector signal amplifier and as a common collector signal amplifier on alternate half cycles of the applied input signal to drive said third transistor as a common emitter signal amplifier,
and a feedback means including a resistor connected between the base of said fourth transistor and the emitter of said first transistor, for providing a direct current feedback path around the first and fourth transistors to help stabilize the operating point of the third transistor.

2. An amplifier as defined in claim 1 wherein said transistors are of the NPN type.

3. The amplifier as defined in claim 1 wherein said transistors are of the PNP type.

4. An amplifier as defined in claim 1 further including an emitter resistor connected to the emitter electrode of said first transistors and across the base-emitter of said third transistor.

5. The amplifier as defined in claim 1 comprising a positive feedback means including a resistor connected between the emitter of said fourth transistor and the emitter of said first transistor for cancelling distortions caused by an unbalanced alternating current degeneration.

References Cited

UNITED STATES PATENTS 3,185,933 5/1965 Ehret ---------------- 330—14

NATHAN KAUFMAN, Primary Examiner

U.S. Cl. X.R.

330—18, 20